United States Patent
Umehara

(10) Patent No.: US 6,380,634 B1
(45) Date of Patent: Apr. 30, 2002

(54) CONDUCTOR WIRES AND SEMICONDUCTOR DEVICE USING THEM

(75) Inventor: Norito Umehara, Ibaraki (JP)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/361,502

(22) Filed: Jul. 23, 1999

(30) Foreign Application Priority Data

Jul. 27, 1998 (JP) .......................................... 10-211056

(51) Int. Cl.$^7$ ............................................... H01L 23/48
(52) U.S. Cl. ...................... 257/784; 257/674; 228/180.5
(58) Field of Search ................................ 257/674, 784; 29/851; 228/180.5, 179

(56) References Cited

U.S. PATENT DOCUMENTS

| | | | | |
|---|---|---|---|---|
| 4,928,871 A | * | 5/1990 | Farassat | 228/179 |
| 5,156,323 A | * | 10/1992 | Kumazawa et al. | 228/179 |
| 5,205,463 A | * | 4/1993 | Holdgrafer et al. | 228/102 |
| 5,328,079 A | * | 7/1994 | Mathew et al. | 228/179 |
| 5,623,163 A | * | 4/1997 | Izumi | 257/667 |
| 5,717,252 A | * | 2/1998 | Nakashima et al. | 257/707 |
| 5,842,628 A | * | 12/1998 | Nomoto et al. | 228/180.5 |
| 5,869,905 A | * | 2/1999 | Takebe | 257/787 |
| 5,884,398 A | * | 3/1999 | Eldridge et al. | 29/843 |
| 5,917,235 A | * | 6/1999 | Imura | 257/669 |
| 5,961,029 A | * | 10/1999 | Nishiura et al. | 228/180.5 |
| 5,989,995 A | * | 11/1999 | Nishiura et al. | 438/617 |
| 6,010,057 A | * | 1/2000 | Egger et al. | 228/102 |
| 6,031,281 A | * | 2/2000 | Kang et al. | 257/692 |
| 6,068,180 A | * | 5/2000 | Test | 228/180.5 |
| 6,079,610 A | * | 6/2000 | Maeda et al. | 228/180.5 |

FOREIGN PATENT DOCUMENTS

| | | | | |
|---|---|---|---|---|
| JP | 54-55167 | * | 5/1979 | 228/180.5 |
| JP | 56-153754 | * | 11/1981 | 257/784 |
| JP | 58-192688 | * | 11/1983 | 228/180.5 |

* cited by examiner

*Primary Examiner*—Eddie Lee
*Assistant Examiner*—Lourdes Cruz
(74) *Attorney, Agent, or Firm*—Willliam B. Kempler; W. James Brady; Frederick J. Telecky, Jr.

(57) ABSTRACT

The purpose of this invention is to provide a type of conductor wires which are appropriate for making a thin semiconductor device and can minimize problems of short-circuits between wires. This invention pertains to a type of conductor wires for electrically connecting a semiconductor chip to external conductors. According to this invention, each of conductor wires (5) has first end portion (5a) bonded to electrode pad (2) of semiconductor chip (1), second end portion (5b) bonded to external conductor (4), and bending point ($A_1$) which is positioned between the aforementioned first and second end portions and is bent almost in the direction opposite to the direction that the conductor wire rises at the aforementioned first end portion. As the bending point is bent almost in the direction opposite to the rising direction of the conductor wire, the amount of rise of the conductor wire from the principal surface of the semiconductor chip can be reduced, and the thickness of the semiconductor device can be reduced. Also, by setting said conductor wires (5), and wires (6) of the conventional structure alternately, it is possible to ensure sufficient clearance between wires, so that it is possible to reduce the possibility of short-circuits among the conductor wires.

16 Claims, 3 Drawing Sheets

CONDUCTOR WIRES AND SEMICONDUCTOR DEVICE USING THEM

FIELD OF INVENTION

This invention pertains to a type of conductor wires for making electric connection of a semiconductor chip to external conductors. In particular, this invention provides an excellent type of conductor wires that can reduce the thickness of the package and can avoid problems of short-circuits among the wires.

BACKGROUND OF INVENTION

Wire bonding is the most common method for connecting a semiconductor chip to external conductors, such as a pattern or lead frame on an insulating substrate. In the wire bonding method, the semiconductor chip is connected to the external conductors by fine wires of gold (Au) or aluminum (Al) fed from a tool known as a capillary tool. In the manufacturing process, the wires fed from the capillary tool have one end bonded to the electrode pads of a semiconductor chip, followed by looping, that is, forming a loop, and then have the other end bonded to the external conductors.

The aforementioned wire looping plays an important role in absorbing the influence of contraction of the wires under pressure and heat during the molding operation. On the other hand, however, the amount of rise of the wire loops from the surface of the semiconductor chip directly affects the thickness of the semiconductor device. It is necessary to have sufficiently thick packaging material on the surface of the semiconductor chip to completely cover and shield the aforementioned wires. On the other hand, with the miniaturization trend of electronic and communications equipment, there is a requirement for even smaller and thinner semiconductor devices. Consequently, it is important to further reduce the thickness of the packaging material on tile semiconductor chip.

On the other hand, with progress in realizing higher speeds and more functions for semiconductor devices, the number of connecting terminals of semiconductor devices is on the rise. An increase in the number of the connecting terminals means an increase in the number of the wires inside the device. As a result, along with the aforementioned demand for smaller device sizes, the danger of short-circuits between adjacent wires becomes higher. That is, as the distance between adjacent wires becomes smaller, spread of the wire configuration during manufacturing and deformation of the wires during injection molding lead to short-circuits of the wires. When electrode pads (2) are set in a zigzag pattern on semiconductor chip (1), as shown in FIG. 6, it is possible to increase the number of connecting terminals per unit area. As the distance between wires W is further reduced, the aforementioned problem becomes exacerbated.

As a method for solving the aforementioned problems, a bending point usually called the "bend" (point P in the figure) is formed midway along wire W, as shown in FIG. 7, so as to increase the resistance to deformation. However, even with such a bending point, it is still impossible to eliminate deformation of the wires, and there is still a danger of short-circuits, depending on the configuration of the wires.

As another method to reduce the danger of wire short-circuits, as shown in FIG. 8, the heights of adjacent wire loops are changed alternately in bonding. Even when adjacent wires move near each other in the plane due to the movement of wires during manufacturing, it is still possible to ensure a sufficient gap between the wires in the height direction, and it is thus possible to minimize the danger of short-circuits. However, in order to ensure a sufficient gap in the height direction, the thickness of the packaging material on the semiconductor chip has to be increased. This is a disadvantage.

The purpose of this invention is to provide a type of conductor wires appropriate for realizing a thin semiconductor device.

Another purpose of this invention is to provide a type of conductor wires that can minimize the problem of short-circuiting between wires while the thickness of the semiconductor device is reduced.

SUMMARY OF THE INVENTION

This invention pertains to a type of conductor wires for electrically connecting the semiconductor chip to external conductors. Each of the conductor wires in this invention has a first end portion bonded to the electrode pad of the semiconductor chip, a second end portion bonded to the external conductor, and a bending point which is positioned between the aforementioned first and second end portions and is bent almost in the direction opposite to the direction that the conductor wire rises at the aforementioned first end portion. The aforementioned bending point is usually called the "bend." It refers to the site on the wire intentionally bent during manufacturing. As the bending point is bent almost in the direction opposite to the rising direction of the conductor wire, it is possible to reduce the amount of rise of the conductor wire from the principal surface of the semiconductor chip, so that the semiconductor device can be made even thinner.

According to this invention, in order to reduce the amount of rise of the conductor wire as much as possible, it is preferred that the aforementioned bending point be positioned on the side opposite to the rising side of the conductor wire with respect to the position of a straight line connecting the aforementioned first end portion and the aforementioned second end portion, and that the bending point position be shifted toward the aforementioned first end portion.

Also, in order to further increase the resistance of the conductor wires to deformation, plural said bending points may be formed on each conductor wire.

This invention also provides a type of semiconductor device having the aforementioned conductor wires. The semiconductor device of this invention has plural first conductor wires and plural second conductor wires set close among the aforementioned first conductor wires. Each said first conductor wire has a bending point bent in the rising direction of the conductor wire. Each said second conductor wire has a bending point bent in the direction almost opposite to the rising direction. In this way, a sufficient gap is formed between the conductor wires having bending points in different directions, and the possibility of short-circuits is reduced.

REFERENCE NUMERALS AND SYMBOLS AS SEEN IN THE DRAWINGS

In the figures, 1 is a semiconductor chip, 2 is an electrode pad, 3 a die pad, 4 an inner lead, 5 a conductive wire, 5a and b end portions, and A the bending point.

DESCRIPTION OF THE EMBODIMENTS

Figure 1:
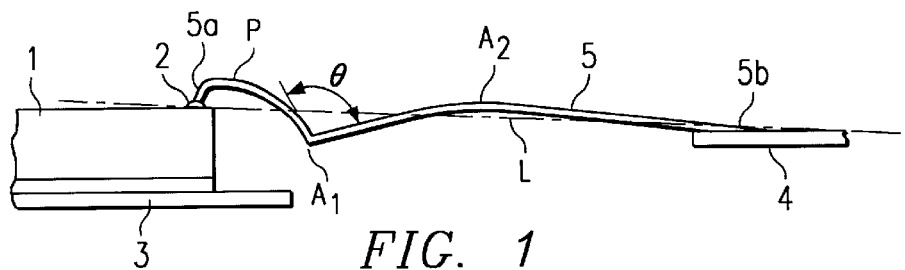
FIG. 1 is an enlarged view of the main portion of the semiconductor device using the conductor wires of this invention.

In the following, the embodiment of this invention will be explained in more detail with reference to figures. FIG. 1 is a diagram illustrating the enlarged main portion of the semiconductor device using the conductor wires of this invention. The semiconductor device shown in FIG. 1 is TQFP (Thin Quad Flat Package). In TQFP, semiconductor chip (1) is attached on die pad (3), and inner leads (4) of the lead frame are set around semiconductor chip (1) at a distance apart from it. Electrode pads (2) set around the principal surface of semiconductor chip (1) and inner leads (4) of the lead frame are electrically connected to each other by conductor wires (5). No further explanation will be made on the general structure of TQFP, as it is well known to specialists.

As shown in the figure, conductor wire (5) has downward bending point $A_1$. Bending point $A_1$ is shifted in position from the midpoint of the total length of conductor wire (5) to end portion (5a) towards electrode pad (2). Conductor wire (5) also has bending point $A_2$ bent a little upward and shifted toward end portion (5b). Conductor wire (5), after rising a little from end portion (5a), extends steeply downward to reach bending point $A_1$. At bending point $A_1$, conductor wire (5) is bent through a large angle. From bending point $A_2$, the conductor wire is gently bent downward to reach end portion (5b) at inner lead (4).

FIG. 1 shows straight line L that connects two end portions (5a) and (5b) of conductor wire (5). Bending point $A_1$ is positioned below said straight line L. If the height position of bending point $A_1$ with respect to straight line L is lowered, the height from the surface of the semiconductor chip to the maximum rise of the conductor wire (position of point P on the wire) becomes smaller. However, if the position of bending point $A_1$ is too low, the stress applied to wire's end portion (5a) becomes larger and may lead to a poor joint at electrode pad (2). In consideration of this problem, it is necessary to adjust the position of bending point $A_1$. As the height position of bending point $A_1$ can be controlled to a certain degree by its opening angle ø, one may adjust said opening angle ø when conductor wires (5) are installed.

In the aforementioned semiconductor device, all of conductor wires (5) led out from electrode pads (2) have the shape shown in FIG. 1. Although not shown in the figure, semiconductor chip (1) and conductor wires (5) are sealed by a molding resin that forms the outer shape of the package.

Figure 2:
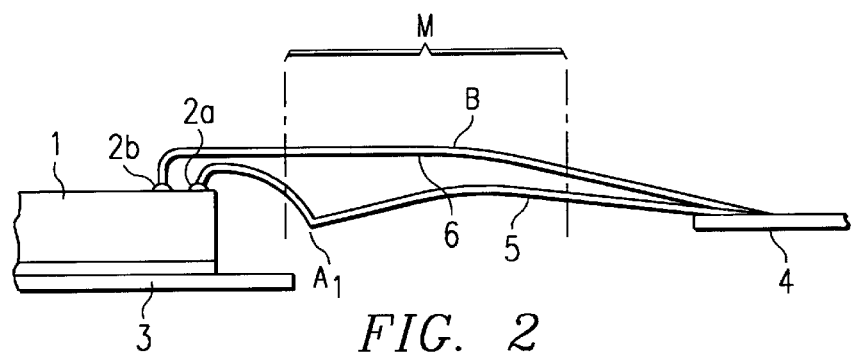
FIG. 2 is a diagram illustrating an example in which this invention is adopted in a semiconductor device using a zigzag-shaped bonding configuration.
Figure 3A:
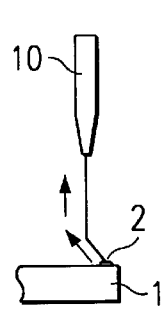
FIG. 3 is a diagram illustrating the bonding procedure for the conductor wires of this invention.
Figure 3B:
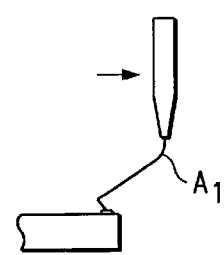
Figure 3C:
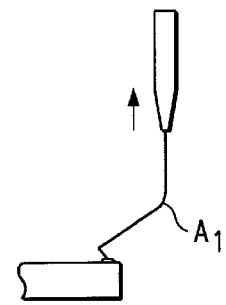
Figure 3D:
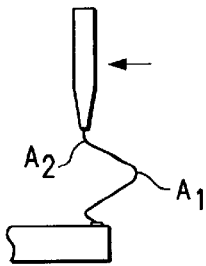
Figure 3E:
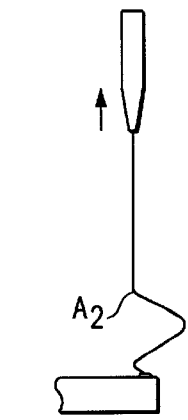
Figure 3F:
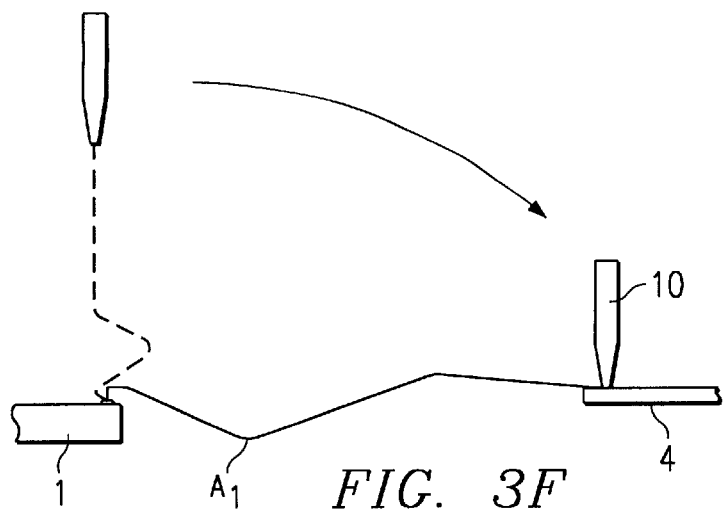
Figure 6:
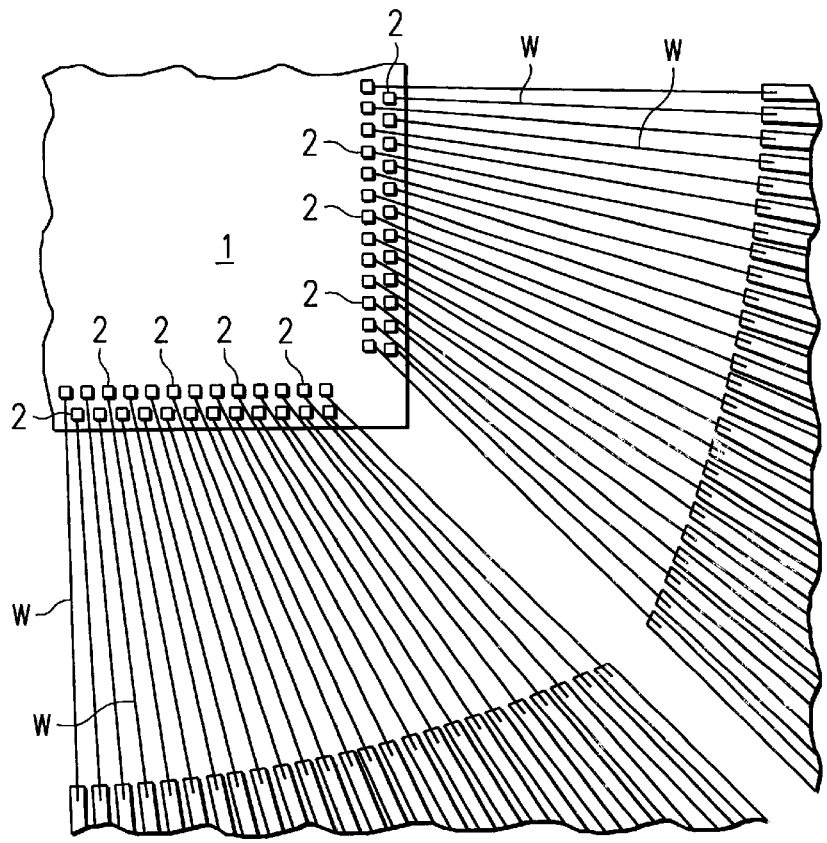
FIG. 6 is a plane view illustrating the shape of the zigzag bonding configuration.
Figure 7:
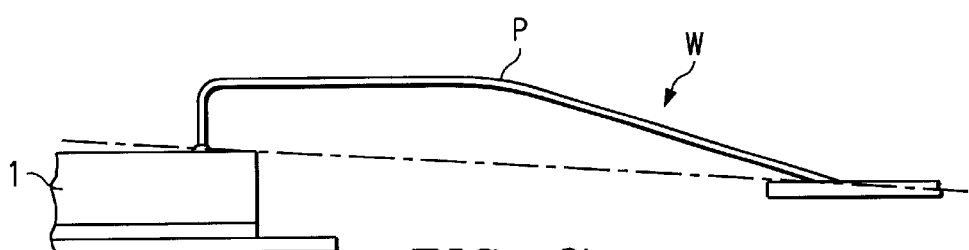
FIG. 7 is a diagram illustrating the shape of conventional conductor wires.
Figure 8:
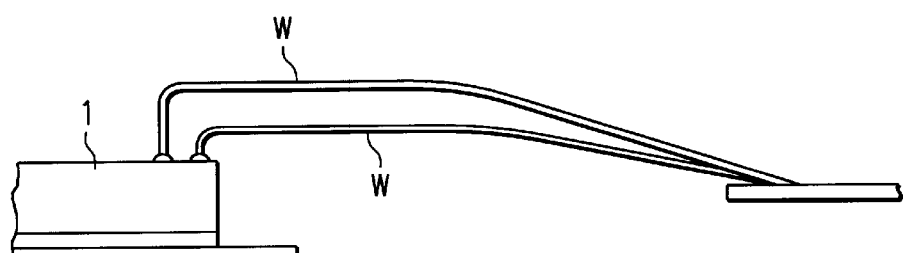
FIG. 8 is a diagram illustrating the shape of conventional conductor wires in a zigzag-shaped bonding confirmation.

FIG. 2 is a diagram illustrating another embodiment of this invention. In this figure, semiconductor chip (1) has electrode pads (2a) and (2b) set in the same zigzag configuration as shown in FIG. 6. In the figure, two types of conductor wires. (5) and (6), with respect to their shape, are shown. Conductor wires (5) have the same shape as shown in FIG. 1, with end portion (5a) bonded to the row of electrode pads (2a) on the outer side. Other conductor wires (6) are conventional lead-out wires, with end portion (6a) bonded to electrode pad (2b) on the inner side. That is, for each conductor wire (6), after leading out vertically from electrode pad (2b), it is bent almost at a right angle so that it extends horizontally. Then, at the middle portion it deviates towards inner lead (4), that is, at bending point B, it is bent slightly, and it then reaches inner lead (4).

Conductor wires (5) and (6) are led out from zigzag-configured electrode pads (2a) and (2b) alternately. Consequently, no conductor wires of the same shape are set adjacent to each other. In this case, bending point $A_1$ of conductor wire (5) faces downward, while bending point B of conductor wire (6) faces upward. Consequently, in middle region M between these two conductor wires, the conductor wires are separated sufficiently from each other in the height direction. For middle region M between the conductor wires, deformation during injection of the molding resin is large, and positional error at the time of wire bonding also appears to be maximum here. Depending on the relative position relationship between the aforementioned two conductor wires, the possibility of contact between wires in said middle region M can be minimized. The two conductor wires are set relatively near each other in the height direction in the regions near the two end portions. However, in the regions near the wire end portions, deformation during injection of the molding resin and error in position during wire bonding are small. Consequently, there is little possibility for the two conductor wires to make contact with each other. Also, said conductor wire (6) has an upward bending point B. However, even when there is no such bending point, for the combination of a wire without such a bending point and said conductor wire (5) having the aforementioned downward bending point, sufficient clearance can still be ensured between the two wires.

FIG. 3 is a diagram illustrating the bonding procedure for conductor wires (5) in FIGS. 1 and 2. Although this procedure is a basic bonding operation not different from the conventional method, the movement path of the capillary tool nevertheless has certain characteristic features in this case, in order to realize the special shape of said conductor wires (5).

At first, a ball is formed on the tip of each wire. By means of ultrasonic waves and hot pressure adhesion from capillary tool (10), the tip of the wire is bonded to electrode pad (2) of the semiconductor chip. After the wire is pulled up obliquely to create the amount of rise of the conductor wire from the chip, capillary tool (10) is further pulled [straight] upward (step (A)). At the position where the bending point is formed a point $A_1$ in the figure), pull-up of capillary tool (10) is stopped. After the capillary tool is moved sideway (step (B)), it is further pulled upward (step (C)).

Then, at the position where bending point $A_2$ is formed in the direction opposite to said bending point $A_1$, capillary tool (10) is moved to the left side (step (D)), and a sufficient bend is applied to bending point $A_1$. Then, the capillary tool is pulled upward (step (E)). Finally, while the wire is pulled out, the capillary tool is driven to move to perform bonding on inner lead (4) (step (F)).

Figure 4:
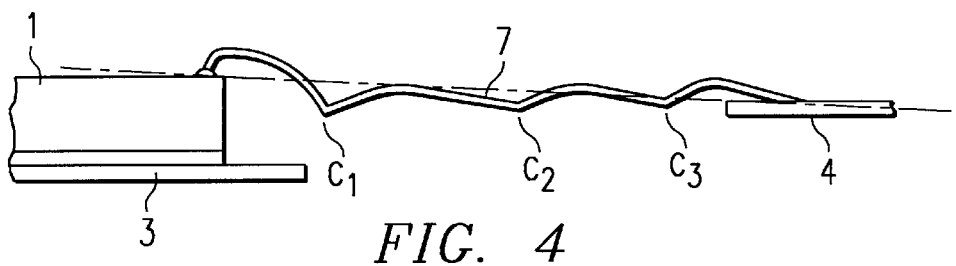
FIG. 4 is a diagram illustrating another embodiment of this invention having plural bending points.

FIG. 4 is a diagram illustrating another embodiment of the conductor wires in this invention. In this embodiment, conductor wire (7) has plural downward bending points C. As shown in the figure, wire (7) has downward bending points C1–C3 formed at three sites so that it is divided into four portions. Formation of plural downward bending points on each conductor wire has the advantage that this can increase the resistance of the conductor wire to deformation, and that it enables setting of the conductor wire such that its entire length is at an average low height. If this embodiment is adopted for one of the two types of wires set alternately as shown in FIG. 2, it is possible to avoid the problem of short-circuits between adjacent wires.

Figure 5:
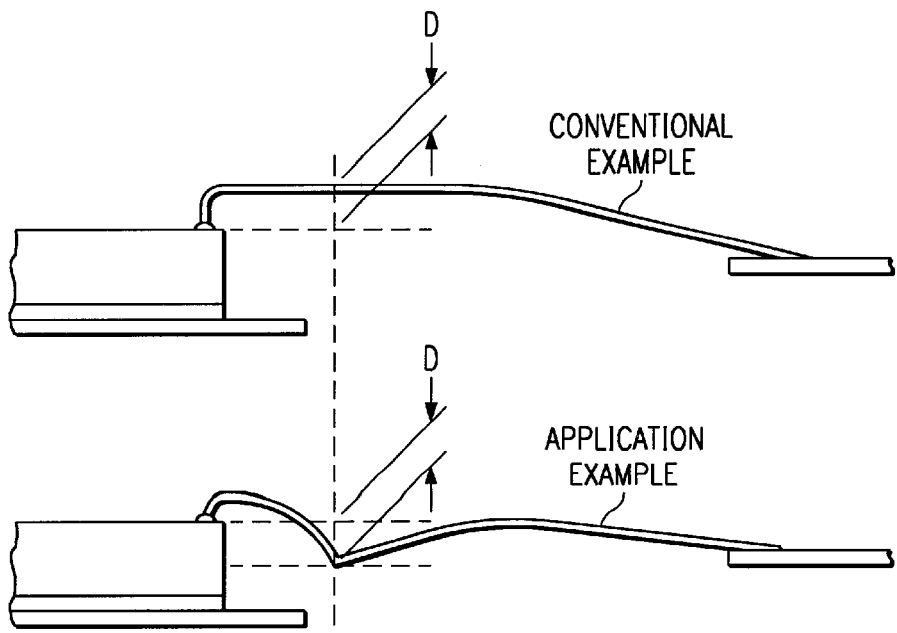
FIG. 5 is a diagram comparing the conventional structure with conductor wires in an embodiment of this invention.

As shown in FIG. 5, samples of conductor wires of the conventional structure and in an embodiment of this invention were prepared, and they were used to compare the height position with respect to the semiconductor chip plane. During formation of the samples, efforts were made to stretch the two wires to have as low a height as possible. Both wires were prepared from Al wires having length of 4 mm and diameter of 25 μm. Measurement of all of the samples was performed to derive height D of the wire at bending point A with respect to the height of the principal surface of the semiconductor chip, taken as a reference. The results are listed in the following table.

TABLE I

| Height of loop | Conventional example (μm) | Embodiment (μm) |
| --- | --- | --- |
| Minimum | 141 | −47 |
| Maximum | 145 | −42 |
| Average | 142.2 | −44.2 |
| Standard deviation | 1.60 | 1.72 |

The results indicated that in this embodiment, the height of the wire at bending point A has an average value as small as 186.4 μm.

In the above, the embodiments of this invention have been explained with reference to figures. However, it is clear that the application range of this invention is not limited to the items defined in the aforementioned embodiments. This invention may be adopted on any type of semiconductor device using conductor wires to electrically connect the semiconductor chip to external conductors. The external conductors for bonding with the conductor wires may be inner leads of a lead frame, a conductor pattern on an insulating substrate, or other conductor parts. Also, this invention may be applied for conductor wires bonded to the pattern on a printed-circuit board when the bare chip is assembled directly on a printed board. The conductor wires of this invention may be realized in TQFP, BGA (Ball Grid Array), CSP (Chip Size Package), and other semiconductor devices as long as conductor wires are used.

According to this invention, the amount of rise of conductor wires from the principal surface of a semiconductor chip can be reduced. As a result, it is possible to realize a thin semiconductor device.

Also, according to this invention, it is possible to realize a relatively large distance between adjacent conductor wires, and it is possible to minimize problems related to short-circuits between wires.

What is claimed is:

1. Conductor wiring for electrically connecting a semiconductor chip to an external conductor, said seminconductor chip having a bottom mounted on a base, and an electrode pad or bond pad on a top thereof facing in a first direction, said base having said external conductor on a surface thereof facing in said first direction; said wiring comprising:

a first bonding wire having a first end bonded to said electrode pad on said top of said semiconductor chip, said wire having a second end bonded to said external conductor; and a bending point formed in said wire between said first and second ends, said bending point being at a level between said top of said semiconductor chip and said bottom thereof, whereby height of said wire above said semiconductor chip is reduced.

2. Conductor wiring of claim 1 wherein said bending point is bent in a direction towards said bottom of said semiconductor chip.

3. Conductor wiring of claim 1 wherein said bending point is closer to said first end than to said second end.

4. Conductor wiring of claim 1 wherein there are plural bending points in said wire, at least one of said plural bending points being at a level between said top of said semiconductor chip and said bottom thereof.

5. Conductor wiring of claim 1 further comprising:

a plurality of electrode pads on said semiconductor chip;

a plurality of external conductors;

a plurality of bonding wires, at least one first bonding wire and at least one second bonding wire not having a bending point formed at a level between said top and said bottom of said semiconductor chip.

6. Conductor wiring of claim 5 further comprising a plurality of first bonding wires and a plurality of second bonding wires, wherein said first bonding wires are interleaved in between a pair of second bonding wires.

7. Conductor wiring of claim 5 wherein said second bonding wire has a bending point above a level of said top of said semiconductor chip.

8. Conductor wiring of claim 6 wherein said plurality of second bonding wires have a bending point above a level of said top of said semiconductor chip.

9. Semiconductor device comprising:

a semiconductor chip having a top side and a bottom side, said top side having a plurality of electrode pads or bond pads thereon facing in a first direction, said semiconductor chip being mounted on a base;

a plurality of external conductors on said base and facing in said first direction;

a plurality of bonding wires electrically connecting each one of said plurality of electrode pads to a corresponding external conductor, at least one of said bonding wires being a first bonding wire having a bending point formed in said wire between a first end of said wire bonded to one of said electrode pads and a second end of said wire bonded to one of said external conductors, said bending point being at a level between said top side and said bottom side of said semiconductor chip, whereby height of said wire above said semiconductor chip is reduced; and a body enclosing said semiconductor chip and said bonding wires.

10. Semiconductor device of claim 9 wherein said bending point is bent in a direction towards said bottom side of said semiconductor chip.

11. Semiconductor device of claim 9 wherein said bending point is closer to said first end than to said second end.

12. Semiconductor device of claim 9 wherein there are plural bending points in said wire, at least one of said plural bending points being at a level between said top side and said bottom side of said semiconductor chip.

13. Semiconductor device of claim 9 wherein said plurality of bonding wires includes at least one second bonding wire not having a bending point formed at a level between said top side and said bottom side of said semiconductor chip.

14. Semiconductor device of claim 13 further comprising a plurality of first bonding wires and a plurality of second bonding wires wherein said first bonding wires are interleaved in between a pair of second bonding wires.

15. Semiconductor device of claim 13 wherein said second bonding wire has a bending point above a level of said top side of said semiconductor chip.

16. Semiconductor device of claim 14 wherein said plurality of second bonding wires have a bending point above a level of said top side of said semiconductor chip.

* * * * *